(12) United States Patent
Iguchi et al.

(10) Patent No.: US 7,358,609 B2
(45) Date of Patent: Apr. 15, 2008

(54) SEMICONDUCTOR DEVICE

(75) Inventors: Manabu Iguchi, Kawasaki (JP);
Toshiyuki Takewaki, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/184,946

(22) Filed: Jul. 20, 2005

(65) Prior Publication Data

US 2006/0017167 A1    Jan. 26, 2006

(30) Foreign Application Priority Data

Jul. 26, 2004    (JP) .............................. 2004-217443

(51) Int. Cl.
*H01L 23/48* (2006.01)
*H01L 23/52* (2006.01)
*H01L 23/053* (2006.01)

(52) U.S. Cl. ................ 257/758; 257/700; 257/E23.173

(58) Field of Classification Search ................ 257/758, 257/750, E23.173
See application file for complete search history.

(56) References Cited

U.S. PATENT DOCUMENTS

| | | | |
|---|---|---|---|
| 6,452,274 B1* | 9/2002 | Hasegawa et al. | 257/758 |
| 6,707,156 B2 | 3/2004 | Suzuki et al. | |
| 2001/0022399 A1* | 9/2001 | Koubuchi et al. | 257/758 |
| 2003/0034567 A1* | 2/2003 | Sato et al. | 257/786 |
| 2003/0173674 A1 | 9/2003 | Nakamura | |
| 2005/0093160 A1* | 5/2005 | Otsuka | 257/758 |

FOREIGN PATENT DOCUMENTS

| | | |
|---|---|---|
| JP | 2002-231815 | 8/2002 |
| JP | 2004-039951 | 2/2004 |

* cited by examiner

*Primary Examiner*—Nitin Parekh
(74) *Attorney, Agent, or Firm*—Young & Thompson

(57) ABSTRACT

A semiconductor device having a structure which can be manufactured with a higher yield includes a local interconnection layer 14 (a first interconnection layer) on a semiconductor substrate 10 and a global interconnection layer 18 (a second interconnection layer) on the local interconnection layer 14. The local interconnection layer 14 and the global interconnection layer 18 include a local interconnection 24 (a first interconnection) and a global interconnection 28 (a second interconnection), respectively, and the global interconnection 28 is thicker than the local interconnection 24. The local interconnection layer 14 and the global interconnection layer 18 also have a dummy interconnection 34 (a first dummy interconnection) and a dummy interconnection 38 (a second dummy interconnection), respectively. The dummy interconnection 34 is narrower than the dummy interconnection 38.

9 Claims, 2 Drawing Sheets

SEMICONDUCTOR DEVICE

This application is based on Japanese patent application No. 2004-217443, the content of which is incorporated hereinto by reference.

BACKGROUND OF THE INVENTION

1. Field of the Invention

This invention relates to a semiconductor device.

2. Description of the Related Art

Conventional semiconductor devices have been described in, for example, Japanese Patent Laid-open Nos. 2002-231815 and 2004-39951. In the semiconductor device described in these references, in an interconnection layer, a dummy interconnection is formed together with a common interconnection. A dummy interconnection is formed for a local uniform data rate in an interconnection layer. Here, a data rate refers to an area rate of an interconnection in an interconnection layer. A uniform data rate can improve uniformity in a thickness of a Cu buried in forming an interconnection, and also provide a Cu interconnection with higher flatness in subsequent CMP (Chemical Mechanical Polishing).

Some semiconductor devices having a multilayer interconnection structure has a dummy interconnection in each interconnection layer. For such a semiconductor device, it has been technically common to commonly use, among all interconnection layers, a dummy interconnection having a width in accordance with an interconnection rule for a global interconnection, in order to reduce a data volume of EB data (Electron Beam Exposure Data) for drawing a mask. In other words, increase of EB data volume has been reduced by using dummy interconnections with an equal size in all interconnection layers, whose width are relatively larger.

However, there is room for improvement in a conventional semiconductor derive with the above configuration in terms of an yield. After intense investigation, we have found out the causes for yield reduction in a conventional semiconductor device. Specifically, although a local interconnection has a smaller width and a smaller thickness than a global interconnection, a dummy interconnection with a size in accordance with an interconnection rule for a global interconnection is disposed near a local interconnection in a conventional semiconductor device.

Thus, in a process for manufacturing the semiconductor device, during etching a groove for a local interconnection, there may be unevenness in a width and a thickness of a groove between an area near a dummy interconnection and an area not near a dummy interconnection. There is a big difference of etching rate between an area near a dummy interconnection and an area not near a dummy interconnection. It is because in an area near a dummy interconnection, a larger amount of etchant is consumed for a groove for the dummy interconnection.

Recently, as a thickness of a local interconnection has become thinner, influence of the above-described unevenness has become significant, and thus it has been probably manifested as reduction in an yield of a semiconductor device.

SUMMARY OF THE INVENTION

To solve the above problems, there is provided a semiconductor device comprising a first interconnection layer having a first interconnection and a first dummy interconnection on a semiconductor substrate, and a second interconnection layer having a second interconnection and a second dummy interconnection on the first interconnection layer, wherein the first interconnection is thinner than the second interconnection and the maximum width of the first dummy interconnection is smaller than the minimum width of the second dummy interconnection.

In this semiconductor device, a width of a dummy interconnection is appropriately determined for each interconnection layer, depending on a thickness of an interconnection in each interconnection layer. Specifically, a width of the first dummy interconnection is relatively smaller in the first interconnection layer comprising the first interconnection with a relatively smaller thickness, while being relatively larger in the second dummy interconnection comprising the second interconnection layer with a relatively larger thickness. Thus, in a process for manufacturing the semiconductor device, variation in a width and a depth of a groove for the first interconnection can be minimized during etching. There can be, therefore, provided a semiconductor device having such a structure that it can be manufactured in a higher yield.

An interconnection includes all the interconnections except the dummy interconnection in the interconnection layer and does not include a pad. A width of a dummy interconnection is defined as a length of a narrow side when a planar shape of the dummy interconnection is rectangular (particularly, a length of one side in the case of a square), and a length of its minor axis when its shape is elliptic (particularly, a diameter in the case of a circle). The "maximum" and the "minimum" widths of a dummy interconnection indicate that when a width of a dummy interconnection in each interconnection layer varies, its dimension is defined as the maximum and the minimum widths.

A width of the first dummy interconnection may be within the range of the minimum width to the maximum width of the first interconnection both inclusive, while a width of the second dummy interconnection may be within the range of the minimum width to the maximum width of the second interconnection both inclusive. Here, a width of the dummy interconnection is appropriately adjusted depending on a width of the interconnection in each interconnection layer, resulting in more reliable reduction in the above variation.

Assuming that the maximum aspect ratio of the second dummy interconnection is 1, the minimum aspect ratio of the first dummy interconnection may be 0.5 to 10 both inclusive. An "aspect ratio" as used herein, is defined as a value calculated by dividing a thickness of the dummy interconnection by its width. Thus, since a difference of an aspect ratio in a dummy interconnection between interconnection layers is small, a dummy interconnection with a desired width and a desired thickness can be readily prepared in any interconnection layer.

The minimum width of the second dummy interconnection may be larger than the minimum inter-interconnection distance in the second interconnection. Herein, the minimum inter-interconnection distance in the second interconnection is defined as the minimum distance between the second interconnections in the second interconnection layer. Here, a second dummy interconnection can be prevented from entering between adjacent second interconnections separated at the minimum interconnection distance, and increase in a stray capacitance in the second interconnection layer can be minimized.

This invention can provide a semiconductor device having such a structure that it can be manufactured in a higher yield.

BRIEF DESCRIPTION OF THE DRAWINGS

The above and other objects, advantages and features of the present invention will be more apparent from the following description taken in conjunction with the accompanying drawings, in which.

In these drawings, the symbols have the following meanings; 1: semiconductor device, 10: semiconductor substrate, 12: circuit-forming layer, 14: local interconnection layer (first interconnection layer), 16: semi-global interconnection layer, 18: global interconnection layer (second interconnection layer), 24: local interconnection (first interconnection), 26: semi-global interconnection, 28: global interconnection (second interconnection), 34: dummy interconnection (first dummy interconnection), and 38: dummy interconnection (second dummy interconnection).

DETAILED DESCRIPTION OF THE PREFERRED EMBODIMENT

The invention will be now described herein with reference to an illustrative embodiment. Those skilled in the art will recognize that many alternative embodiments can be accomplished using the teachings of the present invention and that the invention is not limited to the embodiments illustrated for explanatory purpose. In describing the drawings, the same elements have the same symbol, whose description is not repeated.

Figure 1:
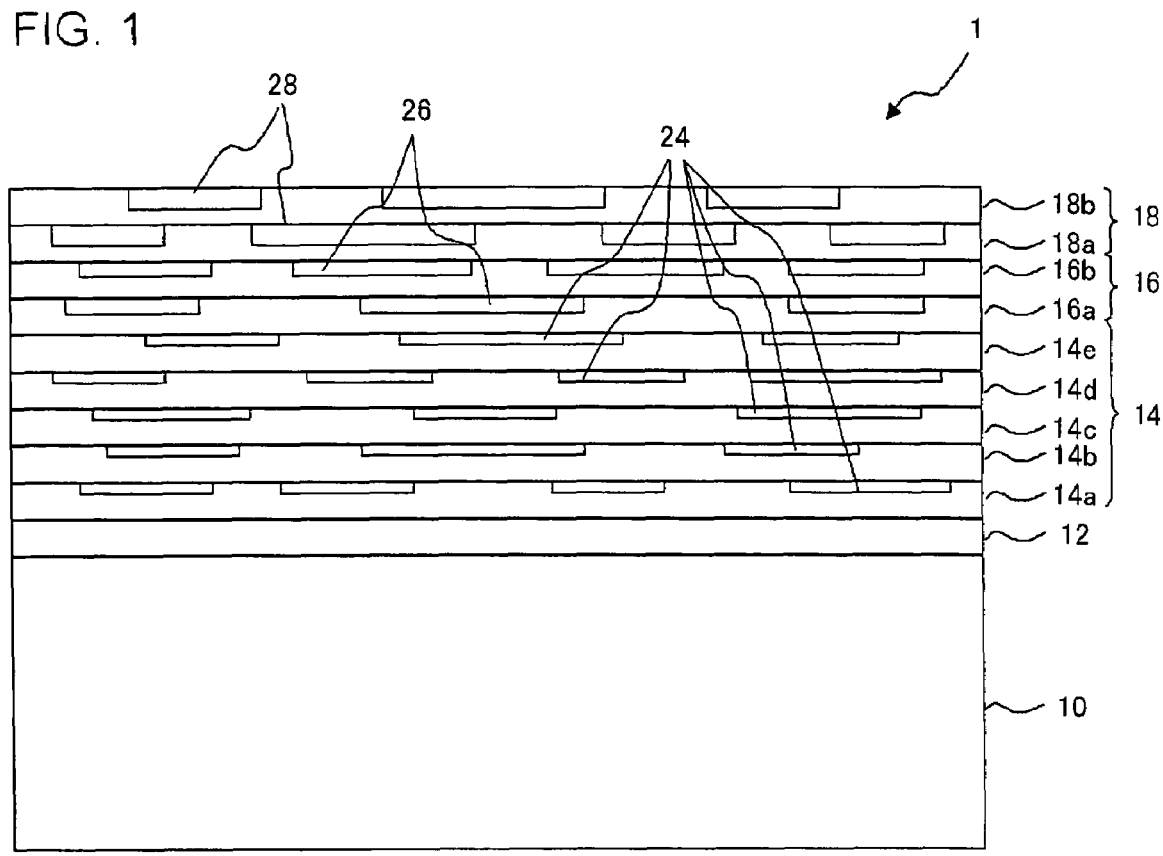
FIG. 1 is a cross-sectional view illustrating an embodiment of a semiconductor device according to this invention.

FIG. 1 is a cross-sectional view illustrating an embodiment of a semiconductor device according to this invention. A semiconductor device 1 comprises a semiconductor substrate 10, a circuit-forming layer 12, a local interconnection layer 14 (a first interconnection layer), a semi-global interconnection layer 16, and a global interconnection layer 18 (a second interconnection layer). The semiconductor substrate 10 may be, for example, a silicon substrate or a compound semiconductor substrate. On the semiconductor substrate 10, a circuit-forming layer 12 is formed. The circuit-forming layer 12 comprises, for example, a gate electrode of a transistor (not shown).

On the circuit-forming layer 12, there are a local interconnection layer 14, a semi-global interconnection layer 16 and a global interconnection layer 18 in sequence. The local interconnection layer 14 specifically consists of five local interconnection layers 14a to 14e. Each of the layers 14a to 14e comprises a local interconnection 24 (a first interconnection). The interconnection 24 in the local interconnection layer 14a is particularly referred to as a first meal.

The semi-global interconnection layer 16 consists of two semi-global interconnection layers 16a, 16b. Each of the layers 16a, 16b comprises a semi-global interconnection 26. Here, the semi-global interconnection 26 is thicker than the local interconnection 24. The global interconnection layer 18 consists of two global interconnection layers 18a, 18b. Each of the layers 18a, 18b comprises a global interconnection 28 (a second interconnection). Here, the global interconnection 28 is thicker than the semi-global interconnection 26, and therefore thicker than the local interconnection 24. The local interconnection 24 has a thickness of about 200 nm. The semi-global interconnection 26 has a thickness of about 300 nm. The global interconnection 28 has a thickness of about 1.20 μm.

In FIG. 1, a contact electrically connecting between interconnections or between an interconnection and a device is not shown.

Figure 2A:
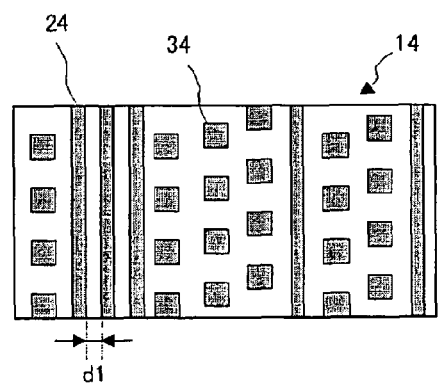
FIGS. 2A and 2B are plan views showing a first interconnection layer and a second interconnection layer, respectively.
Figure 2B:
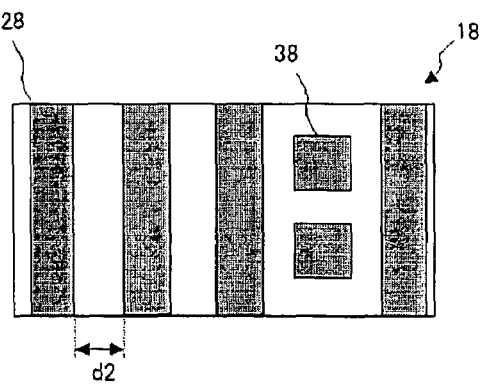

FIG. 2A is a plan view showing the local interconnection layer 14, and FIG. 2B is a plan view showing the global interconnection layer 18. In these figures, the local interconnection layer 14 and the global interconnection layer 18 are shown in the same scale. As apparent from comparison between these figures, a width of the local interconnection 24 is narrower than a width of the global interconnection 28.

A distance d1 in FIG. 2A is the minimum value of a distance between local interconnections 24 in the local interconnection layer 14, i. e., the minimum interconnection distance of the local interconnection 24. Likewise, a distance d2 in FIG. 2B is the minimum interconnection distance of the global interconnection 28. The minimum distance d1 of the local interconnection 24 is smaller than the minimum interconnection d2 of the global interconnection 28. The distance d1 is, for example, about 100 nm while the distance d2 is, for example, about 1.0 μm.

The local interconnection layer 14 and the global interconnection layer 18 comprises a dummy interconnection 34 (a first dummy interconnection) and a dummy interconnection 38 (a second dummy interconnection), respectively. In contrast to the local interconnection 24 and the global interconnection 28 which actually function as an interconnection to which a signal voltage or source voltage is applied, these dummy interconnections 34, 38 are conductor patterns formed for adjusting local data rates in the local interconnection layer 14 and the global interconnection layer 18, respectively. The dummy interconnections 34, 38 are not connected to any of a circuit device and external interconnections. The dummy interconnection 34 can be formed by the same process as that for the local interconnection 24, and is designed to have the substantially same thickness as that of the local interconnection 24. Likewise, the dummy interconnection 38 can be formed by the same process as that for the global interconnection 28, and is designed to have the substantially same thickness as that of the global interconnection 28.

These interconnections can be formed, for example, by forming a groove by etching, depositing a seed over the groove by sputtering, filling the groove with a metal such as Cu by plating and then polishing the metal by CMP. Here, filling with the metal can be effected by CVD. The filling may be conducted after deposition of the seed by CVD.

As apparent from comparison between FIGS. 2A and 2B, a width of the dummy interconnection 34 is smaller than a width of the dummy interconnection 38. In this embodiment, both dummy interconnections 34, 38 have a square planar shape, and their width is defined as a length of one side in the square. A specific width of the dummy interconnection 34 may be appropriately determined, depending on the generation of the local interconnection rule. As the generation proceeds, a width of the dummy interconnection 34 may be shrinked (reduced). A width of the dummy interconnection 34 is, for example, about 0.3 μm. A width of the dummy interconnection 38 is, for example, about 3.0 μm.

The dummy interconnection 34 has a width within the range of the minimum width of the local interconnection 24 to the maximum width of the local interconnection 24 both inclusive. Likewise, the dummy interconnection 38 has a width within the range of the minimum width of the global interconnection 28 to the maximum width of the global interconnection 28 both inclusive. FIGS. 2A and 2B show the local interconnection 24 and the global interconnection 28 with the minimum width, respectively. In practice, a width of the local interconnection 24 varies in the local interconnection layer 14 and the local interconnection 24 with the maximum width has an interconnection width larger than a width of the dummy interconnection 34. Likewise, a width of the global interconnection 28 varies in the global interconnection layer 18, and the global interconnection 28 with the maximum width has an interconnection width larger than a width of the dummy interconnection 38. A width of the dummy interconnection 38 is larger than the above minimum interconnection distance d2 in the global interconnection 28.

In this embodiment, assuming that an aspect ratio of the dummy interconnection (a value calculated by dividing a width of the dummy interconnection 38 by its width) is 1, an aspect ratio of the dummy interconnection 34 is 0.5 to 10 both inclusive.

The semi-global interconnection layer 16 (See, FIG. 1) also comprises an unshown dummy interconnection (hereinafter, conveniently referred to as a "dummy interconnection 36"). A width of the dummy interconnection 36 is larger than a width of the dummy interconnection 34, and smaller than a width of the dummy interconnection 38. Furthermore, a width of the dummy interconnection 36 is within the range of the minimum width to the maximum width of the semi-global interconnection 26 both inclusive. Also, assuming that an aspect ratio of the dummy interconnection 38 is 1, an aspect ratio of the dummy interconnection 36 is 0.5 to 10 both inclusive. Again, in the semi-global interconnection layer 16, a width of the dummy interconnection 36 is larger than the minimum interconnection distance of the semi-global interconnection 26.

Next, the effects of the semiconductor device 1 will be described. In the interconnection layers 14, 16 and 18 in the semiconductor device 1, widths of the dummy interconnections 34, 36 and 38 are appropriately determined depending on thicknesses of the interconnections 24, 26 and 28 in the interconnection layers 14, 16 and 18, respectively. For example, in the local interconnection layer 14, a width of the dummy interconnection 34 is relatively smaller while in the global interconnection layer 18, a width of the dummy interconnection 38 is relatively larger. Thus, in the step of etching in a process for manufacturing the semiconductor device 1, variation in a width and a depth of a groove for the local interconnection layer 14 can be minimized. Thus, there can be provided a semiconductor device 1 with such a structure that it can be manufactured in a higher yield.

In this embodiment, the semi-global interconnection layer 16 is formed and a width of the dummy interconnection 36 in the semi-global interconnection layer 16 is smaller than a width of the dummy interconnection 38. Therefore, also in etching of a groove for the semi-global interconnection 26, variation in its width and depth can be minimized. However, it is not essential to form a semi-global interconnection layer 16 in the semiconductor device 1. Although this embodiment illustrates the local interconnection layer 14 with a five-layer structure, the local interconnection layer 14 may have any number of layers including a single layer. The global interconnection layer 18 may also have any number of layers including a single layer.

It is not necessary that a width of the dummy interconnection 34 is constant in the local interconnection layer 14. It is also true for the dummy interconnections 36 and 38. When each of the dummy interconnections 34 and 38 is not constant, it is acceptable that the maximum width of the dummy interconnection 34 is smaller than the minimum width of the dummy interconnection 38.

Japanese Patent Laid-open Nos. 2002-231815 and 2004-39951 have disclosed a semiconductor device where multiple types of dummy interconnections with different sizes are formed within the same interconnection layer. Particularly, a semiconductor device in Japanese Patent Laid-open No. 2002-231815 has a multilayer interconnection structure. These publications have not, however, described the problem that when a dummy interconnection with a size in accordance with an interconnection rule for a global interconnection is formed in an local interconnection layer, it may cause etching variation during forming a groove for a local interconnection. They have not, therefore, described or implied the configuration of the semiconductor device 1 where a dummy interconnection with a proper size is disposed in each interconnection layer. Thus, in view of the common technique in the prior art, there would have been formed, on all interconnection layers in a global interconnection, dummy interconnections with the same size, specifically a size in accordance with an interconnection rule.

Due to such a configuration, in the semiconductor device described therein, etching variation is significant in forming a groove for an interconnection in a local interconnection layer as described above, thus leading to an inadequate production yield for the semiconductor device. Furthermore, in such a configuration, a large dummy interconnection disposed near a local interconnection also makes it difficult to control a film thickness during plating for forming an interconnection. Additionally, in CMP, dishing in the large dummy interconnection makes it difficult to control a thickness of an interconnection to a desired level. These would be also the causes of reduction in an yield for a conventional semiconductor device.

In contrast, the semiconductor device 1 has a configuration where each interconnection layer comprises a proper size of dummy interconnection, on the basis of our finding obtained in the attempt of solving the problems which have become significant along with recent reduction in a thickness of a local interconnection, such as the above problem of etching variation which influences an yield for a semiconductor device. Thus, there can be provided a semiconductor device 1 in which these problems can be solved and gives an improved production yield.

A width of the dummy interconnection 34 is within the range of the minimum width to the maximum width of the local interconnection 24 both inclusive. A width of the dummy interconnection 38 is within the range of the minimum width to the maximum width of the global interconnection 28 both inclusive. Thus, widths of the dummy interconnection 34 and 38 are adjusted to particularly proper values according to interconnection widths of the interconnection layer 14 and 18, respectively, so that the above etching variation can be further reliably reduced. However, it is not essential that a width of the dummy interconnection 34 or 38 is within the range of the minimum width to the maximum of the interconnection 24 or 28, respectively.

Assuming that an aspect ratio of the dummy interconnection 38 is 1, an aspect ratio of the dummy interconnection 34 is 0.5 to 10 both inclusive. Since a difference between the aspect ratios in the dummy interconnections 34 and 38 in the interconnection layers 14 and 18 is small, a dummy interconnection 34 or 38 with a desired width and a desired thickness can be formed in any type of interconnection layer 14 or 18, respectively. As described above, widths of the dummy interconnections 34 and 38 are not necessarily constant, and thus their aspect ratios are not necessarily constant. When these aspect ratios are not constant, it is acceptable that assuming the maximum aspect ratio of the dummy interconnection 38 is 1, the minimum aspect ratio of the dummy interconnection 34 is 0.5 to 10 both inclusive. It is, however, not essential that there is such a relationship between the aspects ratios of the dummy interconnections 34 and 38. The above aspect ratio is more preferably 0.5 to 7 both inclusive.

A width of the dummy interconnection 38 is larger than the minimum interconnection distance d2 of the global interconnection 28. Thus, the dummy interconnection 38 can be prevented from entering between the global interconnections 28 separated at the minimum interconnection distance d2, and increase in a stray capacitance between the global interconnection 28 and the dummy interconnection 38 can be minimized. When a width of the dummy interconnection 38 is not constant, it is acceptable that the minimum width of the dummy interconnection 38 is larger than the above distance d2.

A width of the dummy interconnection 34 may be shrinked according to the generation, to improve uniformity of a local data rate in the local interconnection layer 14. Thus, variation in an a) etching depth of an interconnection groove can be further reduced and polishing uniformity during CMP can be improved. Furthermore, shrinking a width of the dummy interconnection 34 according to the generation may allow the above data rate to be increased. Thus, a rate of an insulating film in an interconnection layer is relatively reduced, so that mechanical strength of the semiconductor device 1 can be improved. Such an effect is particularly significant when a low dielectric-constant film with lower film strength is used as an insulating film in an interconnection layer.

As described above, a semiconductor device having multilayer interconnection structure according to the prior art comprises a dummy interconnection with a size in accordance with a global interconnection rule for all interconnection layers. For the purpose of this, there may be speculated a configuration that a dummy interconnection with a size in accordance with a local interconnection rule is used for all interconnection layers.

Figure 3A:
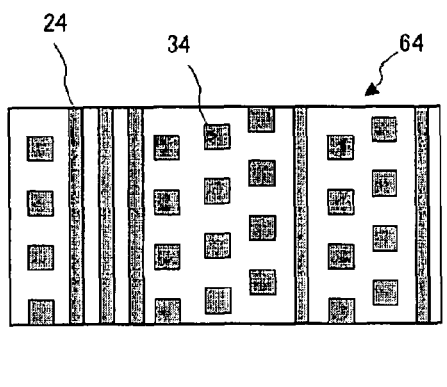
FIGS. 3A and 3B illustrate a configuration of a semiconductor device according to Comparative Example herein.
Figure 3B:
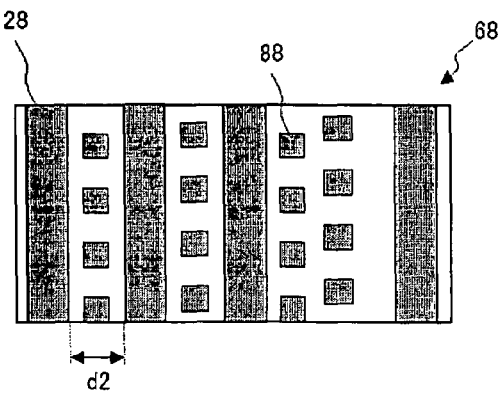

With reference to FIGS. 3A and 3B, a semiconductor device having such a configuration will be described as Comparative Example of this invention. FIG. 3A shows a local interconnection layer 64 in a semiconductor device according to Comparative Example. FIG. 3B shows a global interconnection layer 68 in this semiconductor device. The local interconnection layer 64 has the same configuration as that of the local interconnection layer 14 in the semiconductor device 1. On the other hand, the global interconnection layer 68 comprises a dummy interconnection 88 with a comparable size to the dummy interconnection 34 in the local interconnection layer 64.

In a semiconductor device having such a configuration, as shown in FIG. 3B, a dummy interconnection 88 enters between the adjacent global interconnections 28 separated at the minimum interconnection distance d2, leading to increase of a stray capacitance between the global interconnection 28 and the dummy interconnection 88. Furthermore, when trying to form a dummy interconnection 88 with an appropriate width in the local interconnection layer 64 in the global interconnection layer 68, its aspect ratio is too high to be successfully formed. Thus, it is preferable to use a dummy interconnection having a proper size for each interconnection layer as in the semiconductor device 1, instead of commonly using a dummy interconnection having an appropriate size for a given interconnection layer.

There maybe various modifications for a semiconductor device according to this invention without being limited to the above embodiment. For example, although a dummy interconnection with a square planar shape has been shown in the above embodiment, a planar shape of a dummy interconnection may be, besides square, rectangular. Here, a width of the dummy interconnection is defined as a length of its narrow side. Alternatively, the shape maybe an ellipse including a circle, where a width of the dummy interconnection is defined as a length of a minor axis. Particularly, a width of the dummy interconnection is defined as its diameter.

It is apparent that the present invention is not limited to the above embodiment, that may be modified and changed without departing from the scope and spirit of the invention.

What is claimed is:

1. A semiconductor device comprising:
a first interconnection layer;
a second interconnection layer arranged on the first interconnection layer;
a plurality of first conductive interconnections disposed in the first interconnection layer, each of the first conductive interconnections being electrically connected to at least one of a circuit device and an external connection of the semiconductor device;
a plurality of second conductive interconnections disposed in the second interconnection layer, each of the second conductive interconnections being electrically connected to at least one of a circuit device and an external connection of the semiconductor device;
a plurality of first dummy interconnections disposed in the first interconnection layer, each said first dummy interconnection being disposed entirely within the first interconnection layer except for an upper surface thereof, each said first dummy interconnection being not connected to other said first dummy interconnections in the first interconnection layer and not connected to any of the first conductive interconnections; and
a plurality of second dummy interconnections disposed in the second interconnection layer, each said second dummy interconnection being disposed entirely within the second interconnection layer except for an upper surface thereof, each said second dummy interconnection being not connected to other said second dummy interconnections in the second interconnection layer and not connected to any of the second conductive interconnections;
wherein each of the first and second dummy interconnections and the first and second conductive interconnections has a thickness measured as a distance that a given said interconnection extends into said layer in which the given interconnection is disposed;
wherein the upper surface of each of the first and second dummy interconnections has length and width dimensions, the length being at least as great as the width;
wherein a maximum width of each of the first dummy interconnections is less than a minimum width of each of the second dummy interconnections; and
wherein a thickness of each of the first conductive interconnections is less than a thickness of each of the second conductive interconnections.

2. The semiconductor device of claim 1, wherein each of the first conductive interconnections has a first line width and each of the second conductive interconnections has a second line width;

wherein the line width of the first conductive interconnections is defined by a first range, the line width of the second conductive interconnections is defined by a second range;

wherein the width of each of the first dummy interconnections is within the first range; and wherein the width of each of the second dummy interconnections is within the second range.

3. The semiconductor device of claim 1, wherein a dummy interconnection aspect ratio is defined as a thickness of the dummy interconnection into the layer in which the dummy interconnection is disposed divided by the width of the dummy interconnection; and wherein a maximum aspect ratio of the second dummy interconnections is 1, and a minimum aspect ratio of the first dummy interconnection is 0.5 to 10 both inclusive.

4. The semiconductor device of claim 1, wherein the minimum width of the second dummy interconnections is greater than a minimum inter-interconnection distance among the second conductive interconnections.

5. The semiconductor device of claim 1, wherein the upper surface of each of the first dummy interconnections is rectangular.

6. The semiconductor device of claim 5, wherein the upper surface of each of the first dummy interconnections is square.

7. The semiconductor device of claim 6, wherein the upper surface of each of the second dummy interconnections is square.

8. The semiconductor device of claim 1, wherein the upper surface of each of said first dummy interconnections is elliptical.

9. The semiconductor device of claim 8, wherein the upper surface of each of the first dummy interconnections is circular.

* * * * *